United States Patent
Kou

(10) Patent No.: US 6,778,878 B1
(45) Date of Patent: Aug. 17, 2004

(54) MONITORING ELECTRONIC COMPONENT HOLDERS

(75) Inventor: Yuen-Foo Michael Kou, Melrose, MA (US)

(73) Assignee: Accu-Assembly Incorporated, Reading, MA (US)

( * ) Notice: Subject to any disclaimer, the term of this patent is extended or adjusted under 35 U.S.C. 154(b) by 706 days.

(21) Appl. No.: 09/723,202

(22) Filed: Nov. 27, 2000

(51) Int. Cl.[7] .............................................. G06F 17/00
(52) U.S. Cl. ...................................... 700/221; 700/95
(58) Field of Search ............................ 700/95, 99, 102, 700/115, 116, 121, 213, 215, 220, 221, 225, 226

(56) References Cited

U.S. PATENT DOCUMENTS

| | | | |
|---|---|---|---|
| 3,968,755 A | 7/1976 | Lester | 108/150 |
| 4,175,654 A | 11/1979 | Lodge | 198/398 |
| 5,157,617 A | 10/1992 | Ramsey | 700/223 |
| 5,283,943 A | * 2/1994 | Aguayo et al. | 29/701 |
| 5,455,409 A | 10/1995 | Smith et al. | 235/385 |
| 5,515,600 A | 5/1996 | Iwasaki et al. | 29/740 |
| 5,553,376 A | 9/1996 | Solanki et al. | 29/833 |
| 5,567,927 A | 10/1996 | Kahn et al. | 235/462.01 |
| 5,713,125 A | * 2/1998 | Watanabe et al. | 29/833 |
| 5,838,574 A | 11/1998 | Olson et al. | 700/219 |
| 5,844,593 A | 12/1998 | Proffitt et al. | 347/262 |
| 6,027,019 A | * 2/2000 | Kou | 235/375 |
| 6,031,242 A | 2/2000 | Hudson | 250/548 |
| 6,045,653 A | 4/2000 | Johnson | 156/292 |

FOREIGN PATENT DOCUMENTS

| | | |
|---|---|---|
| DE | 2436439 | 2/1976 |
| EP | 0123972 | 11/1984 |
| GB | 1494407 | 12/1977 |
| JP | 66076 | 1/1994 |
| JP | 66077 | 1/1994 |
| JP | 66098 | 1/1994 |

OTHER PUBLICATIONS

Dallas Semiconductor, "iButton Overview", 2003.*
European Search Report issued for counterpart Application No. EP 97304512.3 (dated Sep. 23, 1997).
International Search Report for PCT/US01/43275.

* cited by examiner

*Primary Examiner*—Leo Picard
*Assistant Examiner*—Chad Rapp
(74) *Attorney, Agent, or Firm*—Fish & Richardson P.C.

(57) ABSTRACT

An electronic component pick and place machine has a series of key readers adjacent its component holder receptacles. The component holders (e.g., feeders) each have a machine-readable holder identification key attached on a flexible cable. When the holders are installed, their keys are inserted into the appropriate readers to be read by a controller to identify and locate the component holders. The controller initiates a holder placement verification check each time a new circuit board enters the machine to be populated, and updates a system component inventory database after each board build. The system database tracks the number and part number of the components loaded on each holder, as well as holder maintenance data.

18 Claims, 10 Drawing Sheets

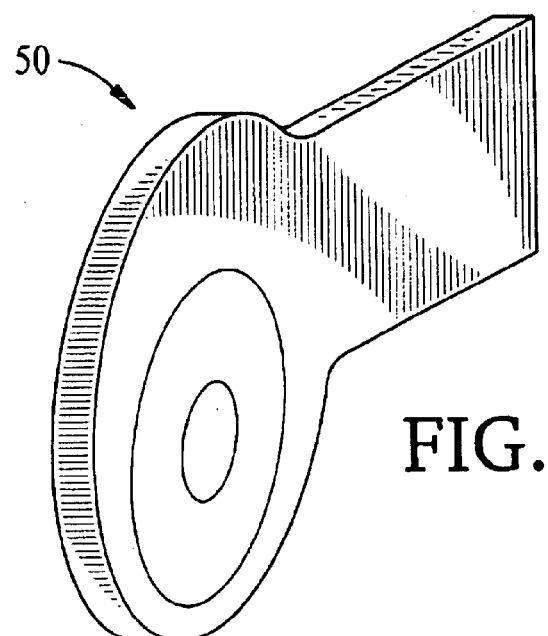
FIG. 10
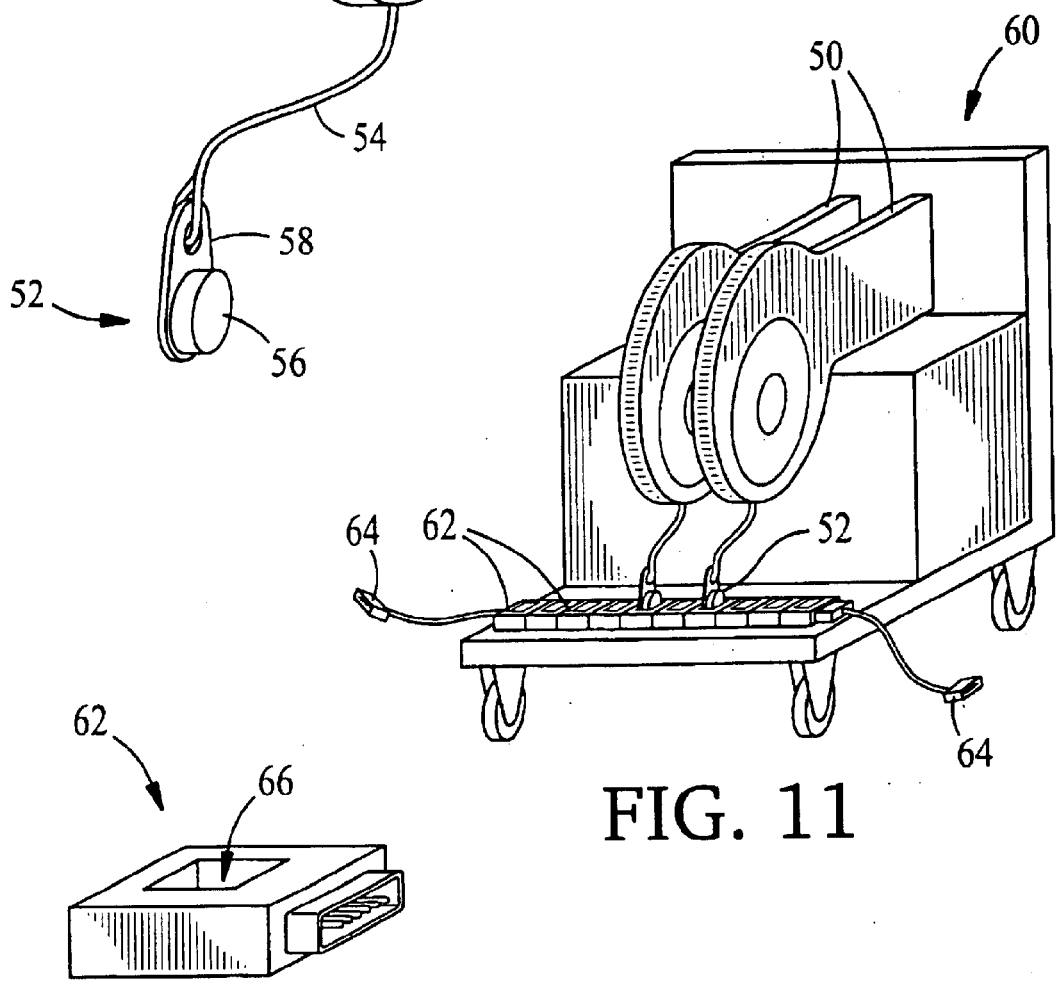
FIG. 11
FIG. 11A

MONITORING ELECTRONIC COMPONENT HOLDERS

TECHNICAL FIELD

This invention relates to monitoring component holders on a component placement machine.

BACKGROUND

Component placement is one of the most labor and data intensive operations in electronic board assembly. Current high-speed component placement equipment can place up to 10,000 to 30,000 components per hour, depending on configuration, and can carry up to 1,000,000 or more individual components.

Surface mount components are typically supplied by component vendors as rolled tapes of components that must be loaded onto individual feeders, sometimes called component dispensing cartridges, that can then be mounted in corresponding feeder slots on the machine. These rolls of components (up to, in some cases, 10,000 or more components per roll) may be loaded onto the feeders either at a stock room or at the machine, and the loaded feeders then loaded into feeder slots. Some components are supplied in tubes or in trays rather than on rolled tape, and must also be placed in a specified location on the machine for picking. As used herein, the term "component holder" is intended to encompass rolled component tape feeders, component tube holders, component bins, and other types of devices for holding a quantity of components for picking. The term "component holder receptacle" means a space on a placement machine for receiving any one of a number of holders, such as a feeder slot.

Component placement machines can have many component holder receptacles (e.g., 150 or more), each accessible by a placement turret or other picking mechanism that picks individual components from the holders in the receptacles and places them in particular locations on a printed circuit board, according to programmed instructions. For application flexibility, each holder and receptacle is generally constructed to be compatible with many different components.

Two classes of placement machines are currently available in the surface mounted component placement equipment market. The turret type of placement machine has a rotating turret on which 10–20 placement heads are mounted. The turret rotates about a fixed vertical axis. The printed circuit board is mounted on a moving table on one side of the turret, and there is a moving bank of feeders on the opposite side of the turret. The turret picks components from the feeders on one side, while placing previously picked components on the other side of the turret. In the gantry type of machine, the printed circuit board and the feeders remain stationary during the placement process, and a pick mechanism is moved on an overhead gantry system. The pick mechanism moves between different feeders to pick up components and then place them onto the printed circuit board. Multi-head gantry systems employ ten to twenty gantry pick mechanisms 'ganged' together to increase the throughput of the machine.

Some prior art attempts to catch assembly errors on gantry-type machines featured manual scanning by the operator. Scannable bar code labels are placed near each slot on the machine. After selecting the machine placement program and loading the program into the system, and just before putting a feeder onto the placement machine, the operator would scan the component part number from the reel in the feeder and then scan the slot number on the placement machine where the feeder was to be located. The system would compare the part number and slot number with the part numbers and slot numbers in the program, and alert the operator if the scanned information did not match the program. If no error was detected, the operator would be prompted to place the feeder onto the placement machine in the scanned slot. Hopefully, the operator would place the feeder in the same slot as scanned.

To improve on the system with manual scanning of part number and slot number, some systems eliminate scanning of the slot number by incorporating a sensor on the slot to sense the presence and absence of a feeder. Just before putting a feeder onto the placement machine, the operator scans the component part number from the reel in the feeder. Then, within a predetermined period of time (e.g., 20 seconds), the operator must place the feeder onto the placement machine. The sensor triggered by the feeder identifies the slot number on which the feeder is placed. If the slot number and part number pair does not match the slot number and part number pair in the placement program, an alarm sounds. All verification is done right next to the machine, with production stopped while the feeders are individually loaded and verified during setup.

In what is sometimes referred to as the "smart feeder" approach, each feeder is embedded with an erasable, programmable read-only memory (EPROM). As the operator loads a component reel into a feeder, he loads the component's part number (hopefully, matching the part number of the components just loaded onto the feeder) into the feeder's EPROM. The placement machine is built with EPROM readers integrated into each slot. When the feeder is placed into a slot, the machine reads the part number in the EPROM. Since the placement machine knows the slot number location of each part number, the placement program is no longer driven by slot number but is driven by part number. For example, part number "12345" can be placed in any slot on the placement machine and the placement machine will go to the correct slot to pick a component with part number "12345". If a different component is to be loaded onto the feeder, the feeder EPROM must be reprogrammed.

The physical arrangement of components, feeders and slots must be in accordance with the expected arrangement as programmed in the machine. Any error in the arrangement can cause a corresponding error in the placement of components on the board. In a high volume, low mix manufacturing environment, a component loading error can produce a high number of defective printed circuit boards in a short period of time. In a low volume, high mix environment the chance of component loading error increases because of frequent feeder manipulation for product change over. If a wrong component is loaded onto the feeder, or the feeder is placed into a wrong slot on the machine, an assembly error is introduced. Because a placement machine can assemble thousands of printed circuit boards in a short time period, an assembly error due to wrong component placement can quickly cause major losses of time and money.

SUMMARY

The invention features a system for guarding against some of the typical loading errors that can occur even with the most conscientious machine operators, as well as providing much-needed inventory and maintenance data.

According to one aspect of the invention, an improvement is provided in a machine for placing electronic components on a printed circuit board. The machine has a series of electronic component holder receptacles for storing electronic components, and a movable pick head for picking selected components in a programmed sequence from component holders placed in the holder receptacles, and placing the picked components in designated locations on a circuit board. In my improvement, the component holder receptacles each have an associated, adjacent key receptacle for receiving a machine-readable holder identification key attached to a component holder to be loaded into the key receptacle after the component holder is loaded into the holder receptacle. The machine also has a controller constructed to identify, from identification keys inserted into the identification key receptacles, the loaded component holders to which the keys are attached.

In some embodiments, the identification keys each include a programmable memory containing holder-specific data, such as remaining component inventory.

In a preferred embodiment, the key receptacles of the component holder receptacles are connected serially, for communicating with the controller over a common data path. The key receptacles of the component holder receptacles each sequentially increment and relay downstream a communication received from the controller, and transfer data to the controller indicating their position along the data path.

The component holder receptacles may be arranged in a first interchangeable bank with their associated key receptacles forming a first key receptacle string, with others of the component holder receptacles arranged in a second interchangeable bank with their associated key receptacles forming a second key receptacle string. The key receptacle strings each have an input serial connector and an output serial connector, for connecting the strings serially for communication with the controller when the interchangeable banks of component holder receptacles are docked on the machine.

In some cases, the controller is constructed to communicate serially with the data keys while the movable pick head is picking electronic components from their associated component holders.

The machine also has, in some configurations, a circuit board output sensor for detecting an assembled board being unloaded from the machine. The controller is constructed to decrement stored inventory values associated with the loaded component holders by programmed amounts, in response to a signal received from the circuit board output sensor. The controller may also, for example, sound an alarm in response to a negative component holder inventory value.

Similarly, the machine may have a circuit board input sensor for detecting a board being loaded onto the machine for component assembly, with the controller constructed to initiate a component holder placement verification sequence in response to a signal received from the circuit board input sensor. In such cases, the component holder placement verification sequence may include polling the data key receptacles for information regarding their location and identification of any component holder loaded in their associated component holder receptacles.

According to another aspect of the invention, a component holder (for holding a quantity of electronic components on an electronic component placement machine) has a machine-readable holder identification key attached to the holder by a flexible cable and containing holder identification information, for insertion into an associated machine data key receptacle when the holder is loaded onto the placement machine.

The identification key, in some embodiments, contains a programmable memory containing holder status information, such as including a part number associated with an electronic component loaded onto the holder, a loaded component quantity, holder maintenance data, or an indication of whether the holder has undergone a specific process, such as a heating cycle, for examples.

According to another aspect of the invention, an improved method of tracking electronic placement machine component holder status is provided. The method includes:

(1) assigning a specific, machine-readable identification code to each one of a set of component holders;

(2) updating a stored relationship between holder identification code and component part number when installing a different set of components on the holder; and (3) electronically reading the identification codes of component holders installed on a placement machine to identify the installed component holders and their individual positions on the placement machine.

According to another aspect of the invention, a package of electronic components includes a housing adapted to be inserted into a component feeder of a placement machine, a multiplicity of electronic components contained within the housing and arranged to be sequentially picked from the package by the placement machine, and a removable label affixed to the package. The removable label has an adhesive backing for remounting the label, after removal from the package, on a component feeder, and light-scannable information printed thereon for identifying the components of the package. Preferably, the package has a multiplicity of such removable labels, for multiple remountings of the package on different feeders.

Features of some embodiments of the invention are disclosed in my U.S. Pat. No. 6,027,019, the entire contents of which are hereby incorporated by reference as if entirely set forth.

The apparatus is particularly well suited for use in placement machines for mounting electronic components on circuit boards. Such machines generally have a series of feeder slots for holding component feeders, and a picking device constructed to pick components from the feeder slots for mounting to a circuit board.

The invention can reduce the chance of component loading error by checking the arrangement of component feeders on a placement machine during a multi-board build and alerting the operator before a mistaken component is placed. Advantageously, the system does not require the machine to sit idle while component arrangement is checked, and the re-verification process can occur during the loading of each board. In addition, the invention can provide accurate component inventory information and track individual feeder use for maintenance purposes, and can detect some feeder replenishment errors through part counting. The components of the system are readily installed on conventional placement machines as an aftermarket addition, and do not interfere with the basic picking operation of the placement machine.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 10 is a perspective view of a component feeder with an attached data key.

FIG. 11 is a perspective view of an interchangeable feeder bank containing two component feeders.

FIG. 11A shows a single identification key reader.

Like reference symbols in the various drawings indicate like elements.

DETAILED DESCRIPTION

Figure 1:
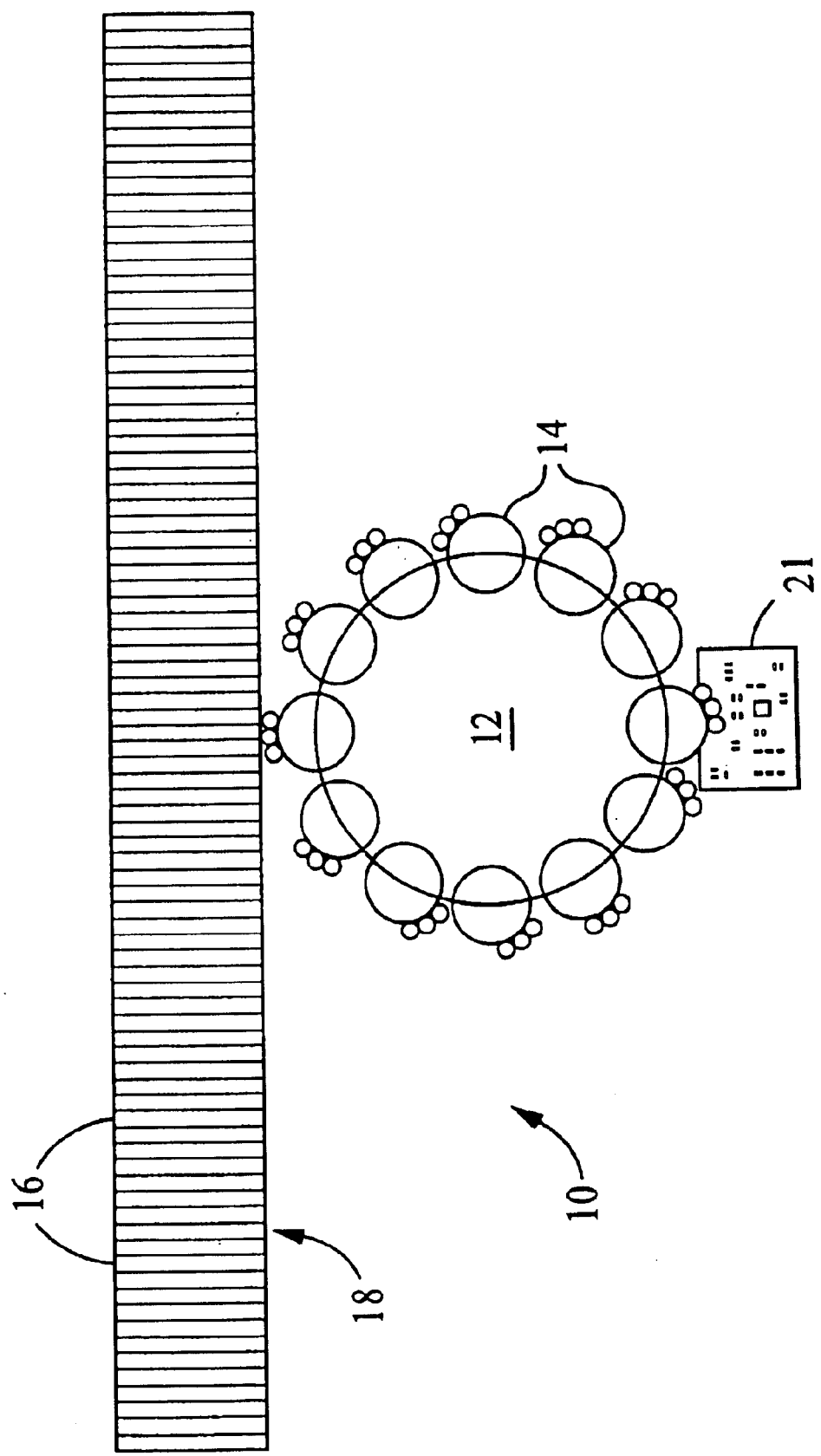
FIG. 1 is a schematic illustration of a first type of component placement machine.

FIG. 1 illustrates the basic components of a component placement machine 10 for mounting electronic components (e.g., surface mount components) on printed circuit boards and the like. In the configuration illustrated, a rotatable turret 12 has several pick-place mechanisms 14 located about its periphery. Each pick mechanism 14 is configured to pick individual components from selected feeders 16 mounted on a movable feeder platform 18 on one side of turret 12 and to place the picked components in predetermined positions on a printed circuit board 21 on the other side of the turret. Feeder platform 18 moves back and forth (along the feeder platform) to present the desired feeder 16 to pick/place mechanisms 14, and can typically hold between about 70 and 150 feeders.

Figure 2:
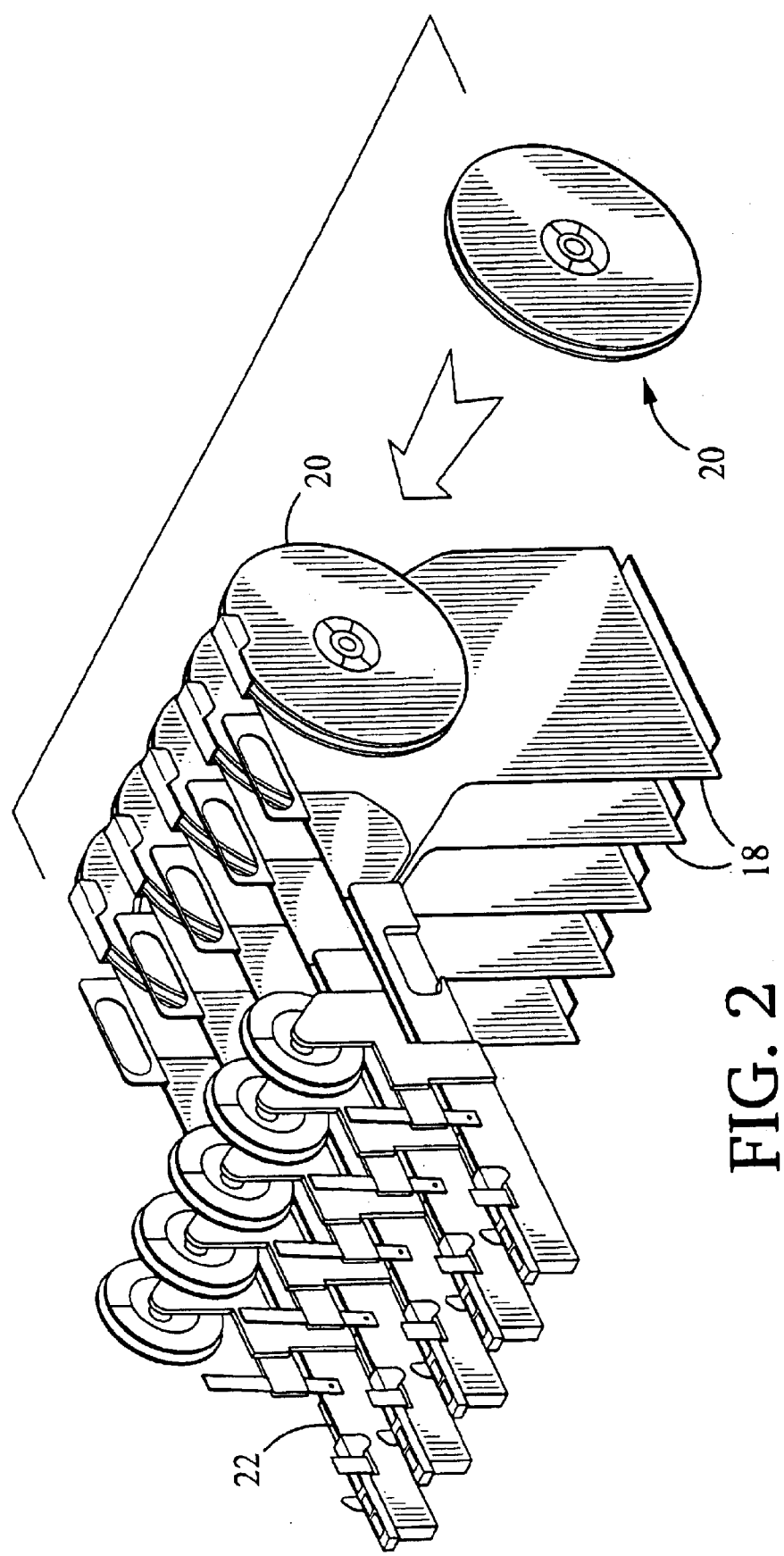
FIG. 2 illustrates loading a component feeder.

Before mounting feeders 16 in their respective slots on feeder platform 18, they are loaded with reels 20 of components as illustrated in FIG. 2. Each feeder is designed to accept several different types of components for assembling a wide range of circuits and products. The loaded feeders 16 are then mounted in slots according to an arrangement prescribed by a placement program that is loaded into the placement machine controller. The placement program contains, among other things, a prescribed association between machine slot numbers and component part numbers.

Each feeder 18 has an associated bar code label 22 affixed to an exposed surface near the dispensing tip of the feeder. Label 22 contains sufficient information to identify the individual feeder. As the feeder is loaded with a particular component reel, which may be done with spare feeders in a stock room away from the machine to avoid excessive down time, the operator inputs the loading information of the feeder. In other words, the operator associates in the database of the monitoring system the identification and quantity of the loaded component with the particular feeder upon which it is loaded. This data input is conveniently performed with a hand-held bar code scanner for reading labels 22 and scannable component identification labels (not shown) provided on reels 20 by the component suppliers. The Electronic Industries Association (EIA) has established a standard format for bar coding such reel labels, in which the bar code graphic indicates, in order, the customer part number, the supplier part number, and the component quantity. Preferably, the EIA standard reel labels are scanned only once and a unique reel label is then assigned to each reel to keep track of the quantity of components on each individual reel in cases where the original reel identification label does not include a reel-specific identification number. When the loaded reels 18 are brought to machine 10 for loading into slots of the feeder platform 18 (FIG. 1), the machine controller prompts the operator to place a given component part number in a given slot based upon information provided in the placement program. The operator determines, typically by looking at the reel identification labels on reels 20, which feeder 18 contains the requested component and loads the feeder into the indicated slot.

Figure 3:
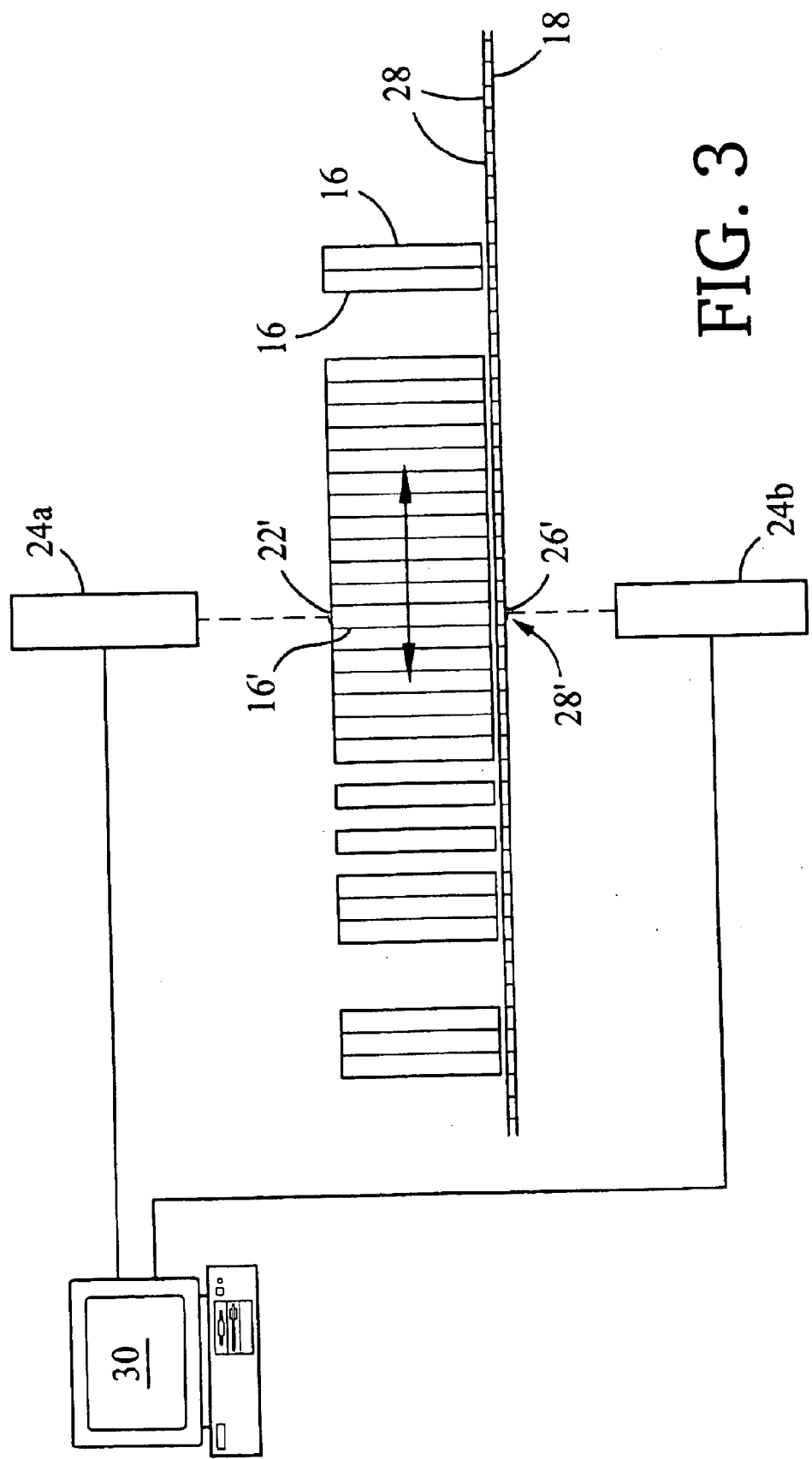
FIG. 3 is a schematic illustration of a feeder configuration monitoring system according to the invention.

Referring to FIG. 3, the monitoring system includes, in this embodiment, a feeder bar code label scanner 24a and a slot bar code label scanner 24b. Feeder platform 18 has a series of slot bar code labels 26 affixed to its exposed lower surface in association with respective slots 28 of the platform. Both scanners are mounted on the stationary portion of the placement machine, such that feeder platform 18 moves back and forth with respect to them to present specific feeders to the pick/place mechanisms. Thus, the scanners do not move with respect to the pick location. Scanner 24a is arranged to scan the label 22' of the feeder 16' aligned at the pick location, and scanner 24b is arranged to scan the slot label 26' of the slot 28' in which the aligned feeder 16' is mounted.

Figure 4:
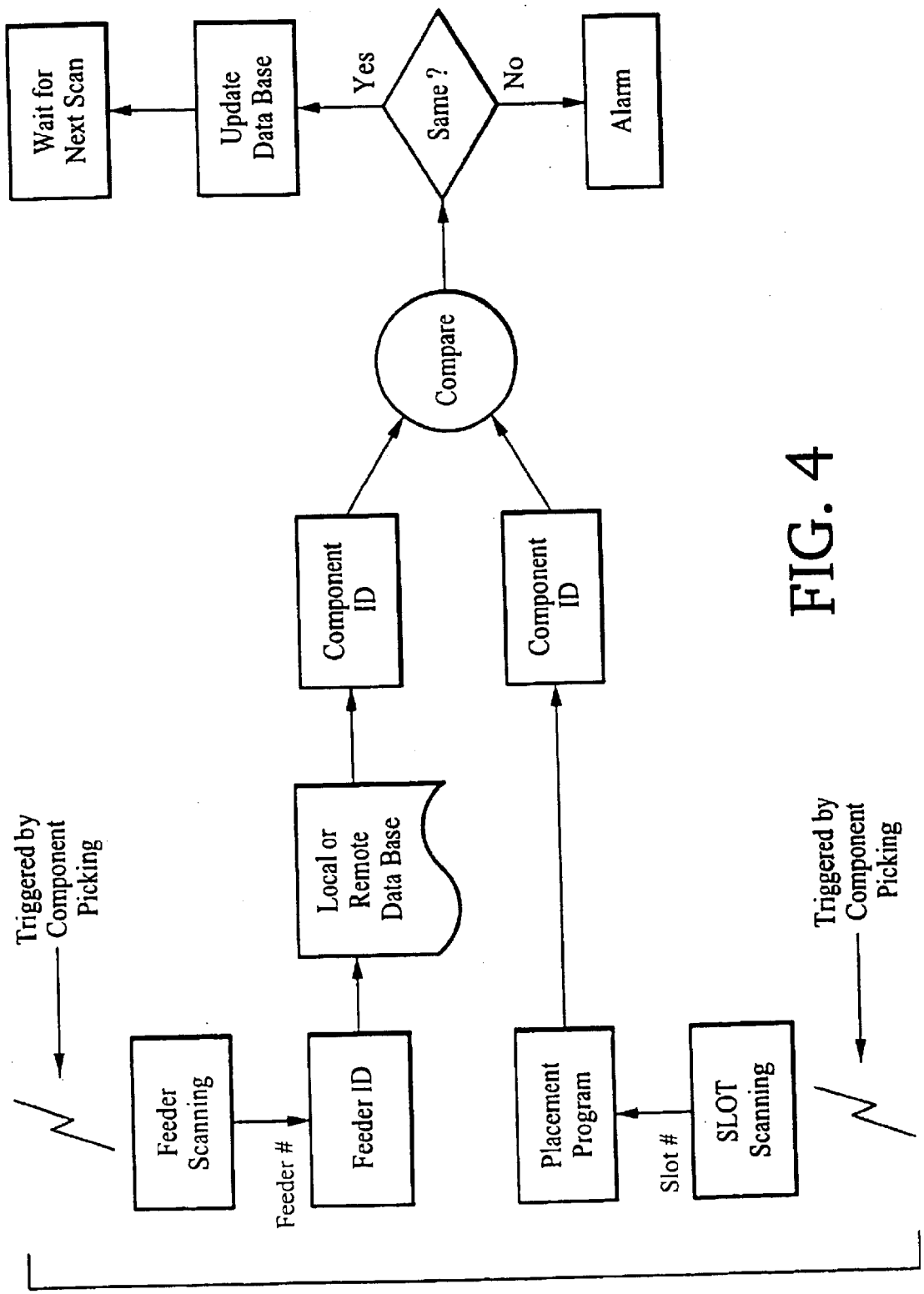
FIG. 4 is a flow diagram of the basic operation of the system of FIG. 3.

With reference also to the flow chart of FIG. 4, when triggered by the picking of a component, scanner 24a scans label 22' to determine the identification of feeder 16'. The picked component is identified by the association between feeder and component reel that was previously input into the system database when the feeder was loaded. Meanwhile, scanner 24b scans slot label 26' to determine the slot number. Referring to information provided by the placement program, the monitoring system determines the component number that is supposed to be loaded at slot 28'. This component identification is compared to the component identification determined by the scanning of feeder label 22' by scanner 24a. If the identifications do not match, an alarm sounds. Thus the system continuously monitors the arrangement of feeders 16 to detect errors in feeder platform loading. If the identification numbers are the same (i.e., the feeder number and slot number indicate the same component identification) then the database is updated and the process repeats upon the next pick. The updating of the database includes decrementing the recorded quantity of components on feeder 16' for inventory control and updating the recorded number of times a particular feeder has been accessed (or picked from) for feeder maintenance purposes. If packaging constraints permit, a single bar code scanner may be employed to scan both the feeder and slot labels.

The computational steps and alarms indicated on FIG. 4 are affected by a personal computer 30 (FIG. 3) running software designed for this purpose. The computer may be connected to the placement machine controller via RS232 or Ethernet connection. Other hardware for implementing the monitoring system on a single conventional placement machine includes the scanners 24*a* and 24*b* and an additional hand-held scanner (not shown) for inputting the feeder loading information as the feeders are loaded with component reels.

Figure 5:
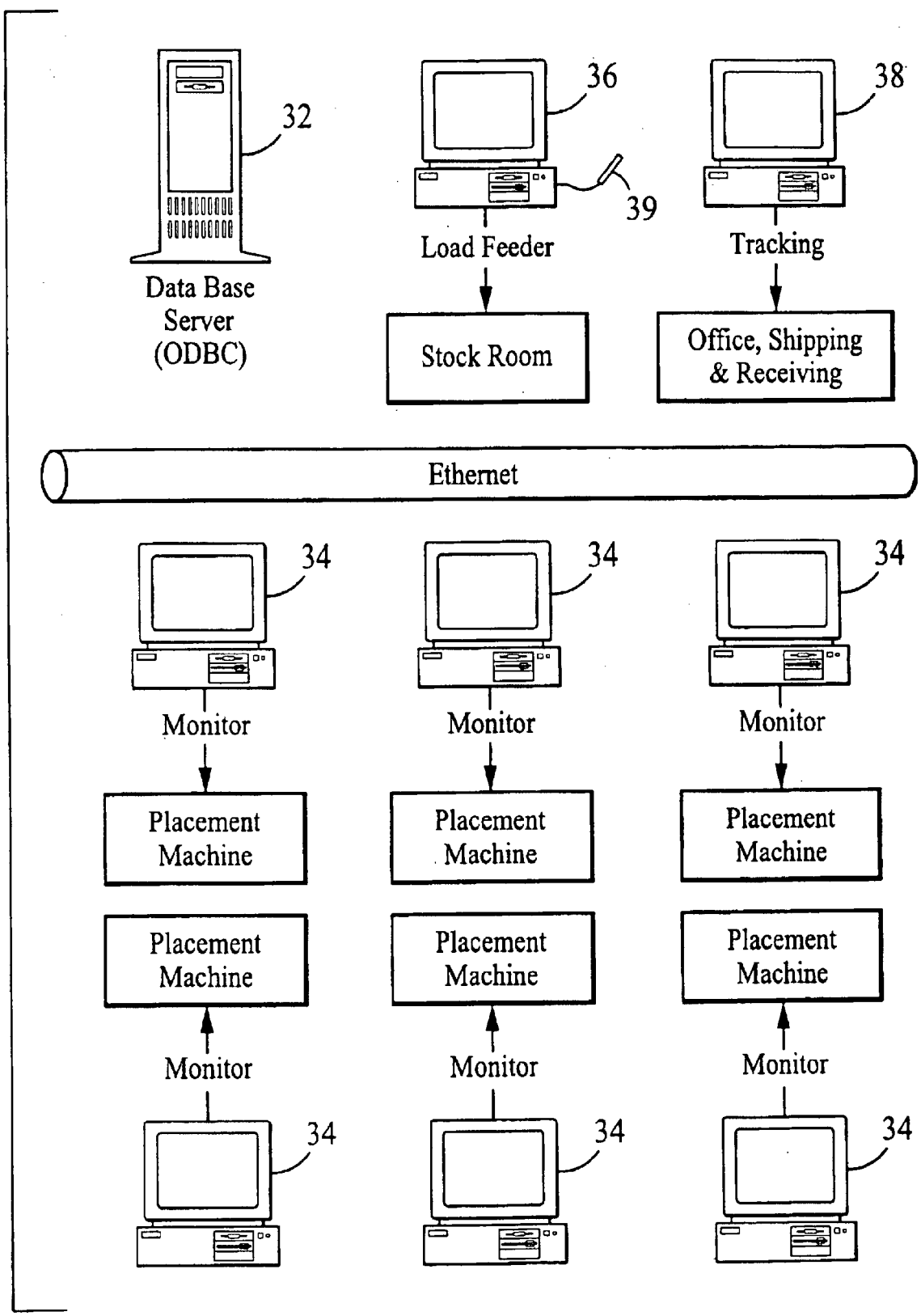
FIG. 5 illustrates a system with several machine monitors and a common database.

In a multi-machine system illustrated in FIG. 5, the database is managed by a central server 32 connected to individual machine monitoring systems 34 by an Ethernet connection. Also connected for access to the database are a loading station 36 and a tracking station 38. Loading station 36 includes a hand-held bar code scanner 39 for inputting feeder loading information as component reels are loaded onto feeders for use on the various machines. Tracking station 38 contains software for accessing database information to track the status of feeders and loaded inventory. Having a common database simplifies the tasks of job supervision and inventory management.

Figure 6:
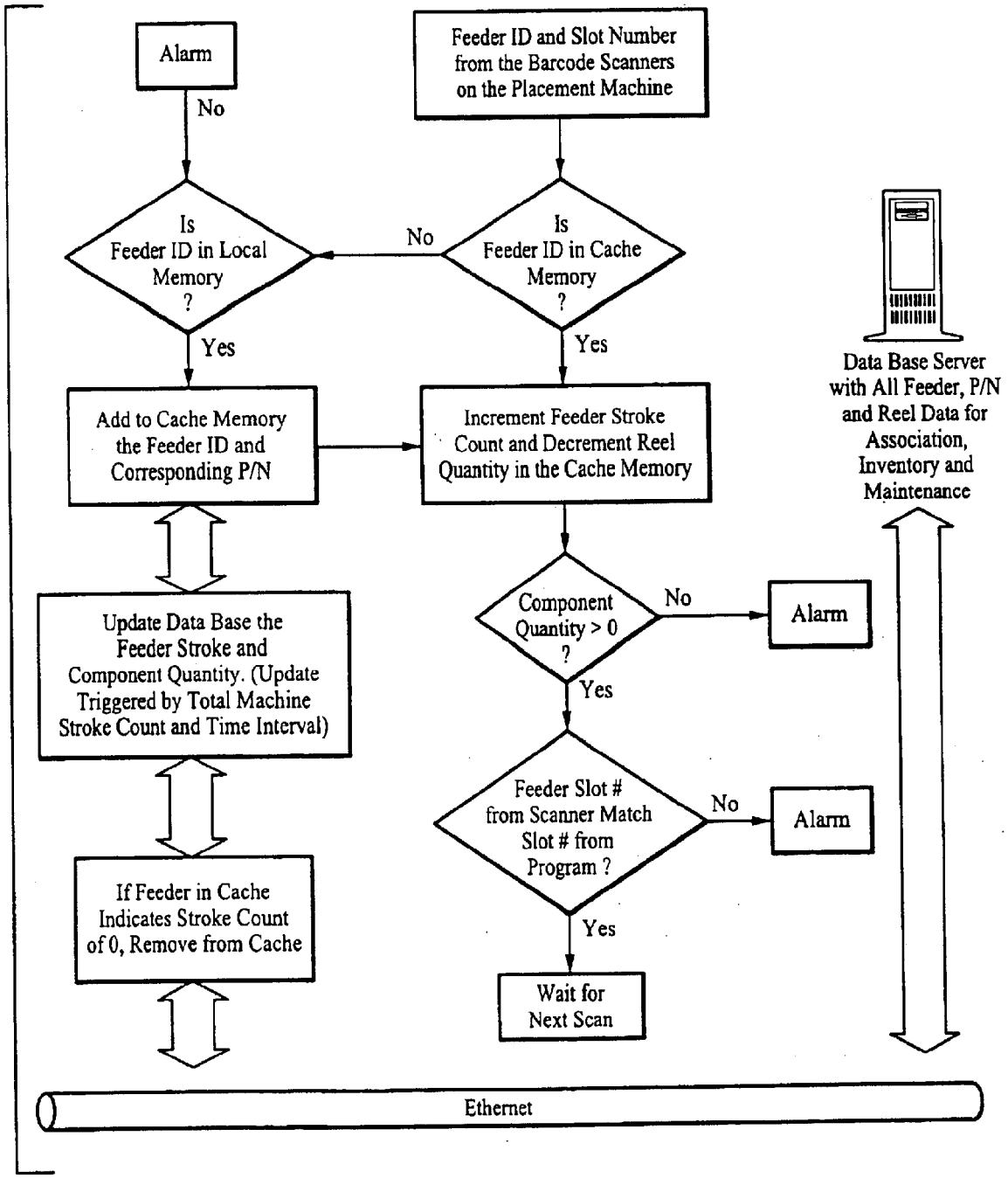
FIG. 6 is a flow diagram partially detailing the memory management of one of the machine monitors in the system of FIG. 5.

Accessing a common database shared by several machines each picking up to 30,000 components per hour can, however, require special considerations. FIG. 6, for instance, illustrates how cache memory management can be employed at each monitoring system for use with extremely fast placement machines and a common database. Before running the placement machine, the monitor system queries the database for all feeder numbers associated with each of the component numbers listed in the placement program and stores this list of feeder IDs in local memory along with the quantity of components known to remain in the feeder (the reel or component quantity). Cache memory is initially empty.

During each pick cycle, the monitor system scans the feeder label (for feeder ID) and slot label (for slot number) at the pick location. If the scanned feeder ID is not found in cache memory, the system looks for the feeder ID in local memory. If not in either memory location, an alarm is generated. If the feeder ID is found in local memory only, the feeder ID is added to cache memory. Cache memory can be thought of as a list of the feeders known to be present on the feeder platform of the machine. Local memory is a list of all feeders the common database associates with the part numbers of the placement program. Therefore, as the machine runs, cache memory will be updated each time the monitor system identifies another feeder on the machine. After each pick, the system increments the feeder stroke count in cache memory (initially zero) and decrements the reel quantity in cache memory. Local memory is not altered once the list of feeders is initially entered from the database. If the component quantity indicates that the feeder is now empty (e.g., that the feeder was replenished without properly scanning in the replacement reel), or if an error is detected in the feeder arrangement (as explained above with reference to FIG. 4), an alarm is generated. Otherwise, the cycle is repeated. In each instance where an alarm is sounded, the monitor system also stops the operation of the placement machine via a switch in its emergency stop ("e-stop") circuit.

After a fixed number of machine strokes (pick cycles), or after a predetermined time interval, the common database is updated over the Ethernet connection. This update task is programmed to be performed as a background task, such that the monitoring tasks associated with the alarms are given highest priority. The current implementation updates the database after every 2,000 picks or every 10 minutes, and these intervals are adjustable by the user. During the update, the feeder stroke count in the database is incremented by the feeder stroke count in cache memory and the cache feeder strokes are reset to zero. The component quantities associated with the feeders in the database are also updated. Coincident with each database update, the cache memory is purged of any feeders not accessed since the previous database update by clearing from cache memory all feeders with stroke counts that have not advanced from zero. This may indicate, for instance, that a feeder has been replaced.

Thus, about every ten minutes or so the common database is updated to reflect the current level of inventory on all feeders in all machines. In circumstances where a substantial portion of component inventory in a plant at any given time is in partially used reels on feeders, the monitoring system doubles as a valuable inventory management tool.

Figure 7:
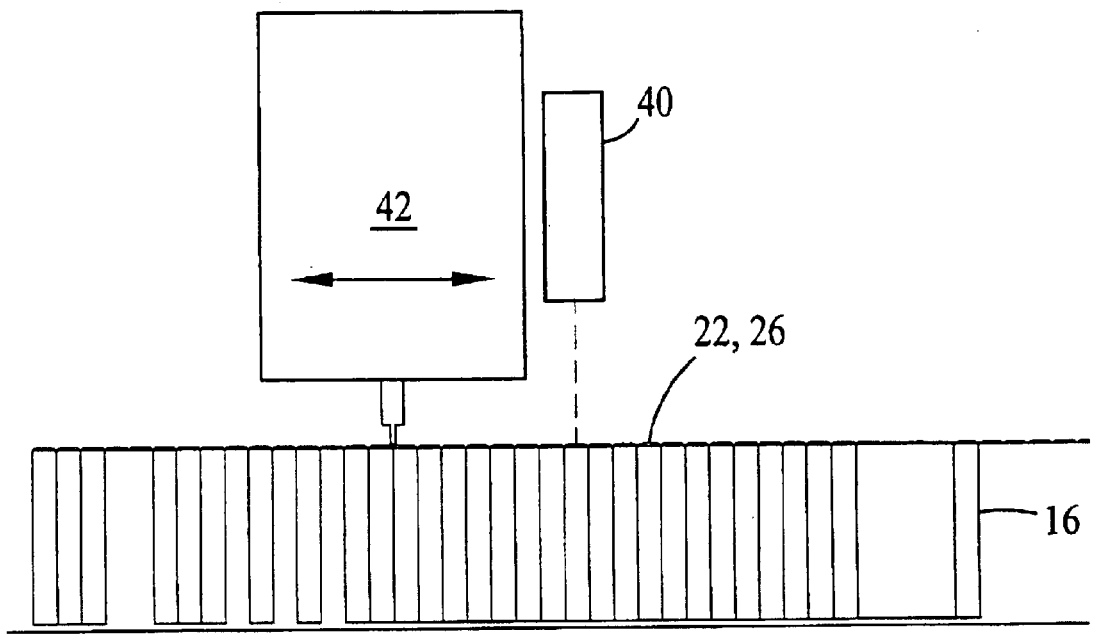
FIG. 7 is a schematic illustration of a second type of component placement machine.

This basic approach is also applicable for use with component placement machines in which the feeder platform remains stationary and the pick location moves, as illustrated in FIG. 7. Machines of such configuration are generally employed for mounting larger components that require very precise location, such as processors. In this embodiment, a single scanner 40 continuously scans associated pairs of slot labels and feeder labels as the translatable picking mechanism 42 moves back and forth, sending a stream of information to the monitoring system to check for errors. As there is no indication to the monitoring system of what feeder is being picked from, this particular embodiment does not monitor feeder inventory or stroke count.

Figures 8, 9:
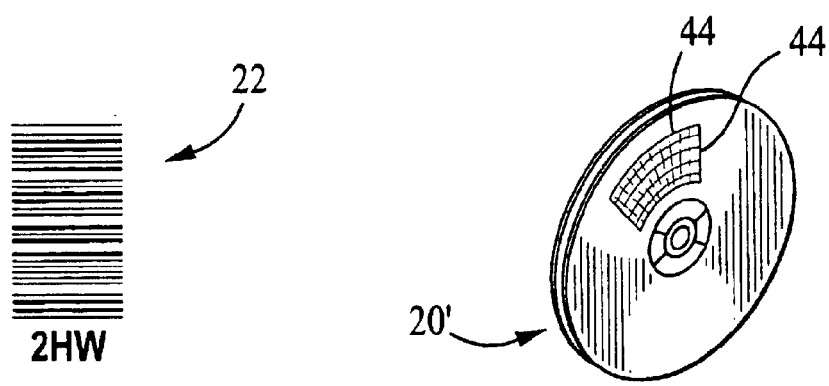
FIG. 8 is an example of a feeder bar code label.
FIG. 9 shows a component reel with removable labels.

The feeder bar code labels 22 can be made very small to fit on available exposed surfaces of standard, commercially available feeders. FIG. 8 shows an actual example of a feeder bar code label 22 developed for a first implementation of the monitoring system. The feeder identification number consists, in this example, of a three-digit alphanumeric sequence. To help avoid confusion between similar characters, a preferred set of alphanumeric characters consists of the numbers 0–9 and the letters A–Z without the letters O, Q, D, G, I, J, U or Z. The resulting character set allows for over 22,000 unique combinations, sufficient to accommodate the number of individual feeders in use at most manufacturing plants.

It is preferred that the feeder bar code labels 22 be placed on the feeders as near as possible to the location of the feeder mount (i.e., the most secure and stable portion of the feeder), in order to avoid issues related to vibrations induced in the feeder by rapid feeder platform accelerations.

Referring to FIG. 9, in another embodiment the component reels 20' are supplied with duplicate, removable component bar code labels 44 of EIA standard format. Labels 44 have an adhesive backing such that they may be applied to the feeder upon which reel 20' is mounted, adjacent the feeder bar code label. This configuration eliminates the need to enter feeder loading information, as the monitor system can be adapted to directly read component identification information simultaneously with feeder identification. Each time a reel is mounted to a feeder, another label 44 is removed and affixed to the feeder, either over the label of the previously installed reel or after removing the old label. Enough labels 44 are provided on reel 20' to accommodate a reasonable number of re-mountings.

Referring now to FIG. 10, a reel-type component feeder 50 has an identification key 52 permanently attached by a flexible cable 54, such as a metal key chain. In this embodiment, key 52 is an "iButton"® machine-readable 16 mm computer chip in a stainless steel can 56, available from Dallas Semiconductor of Dallas, Tex., as Model number DS1990A-F5. The "iButton"® is mounted in a flanged fob

58, Dallas Semiconductor Model number DS9093F. Each "iButton"® comes from the supplier with a unique registration number that can be read by an external reader. In the context of this system, the unique registration number may be employed as the identification number of the associated component feeder 50.

When a reel of components is installed on a particular feeder 50, the operator scans the part number (or serial number of the reel) and the feeder identification code. A key reader may be provided at the scanning station to automatically read the feeder identification code when the operator scans the part number, or the key identification code can be duplicated on a scannable bar code attached to the feeder or key chain and then manually scanned by the operator. This establishes the relationship between feeder and part number in the system database. The operator also enters the quantity of components on the reel, if such information is not already in the system database, associated with the unique reel identification number. Tube or tray components (e.g., fine pitch flat pack or DIP components) are paired either with a loose key or a key attached to their holder. A single loose key may travel through a plant with a stack of component trays, and must be inserted manually into a tray drawer key reader before the system will enable the build sequence.

FIG. 11 shows a portable feeder bank 60 with two feeders 50 mounted in two of its slots. When the feeders are mounted in their chosen slots, their identification keys 52 are placed in corresponding key readers 62 permanently mounted on bank 60 adjacent each feeder slot. As an operator installs feeders 50 into bank 60 to configure the bank for a particular job, he inserts the feeder keys 52 into the appropriate readers 62 on the bank. The configuration of the feeder bank may be completed before the bank is brought to a placement machine for docking. When the bank is docked, the string of readers 62 is connected for serial communication with other component banks and the system controller via end connectors 64.

As shown in FIG. 11A, each reader 62 defines a receptacle 66 for receiving the "iButton"® of a component holder. Each reader 62 also has both male and female serial connectors, one at either end, such that the readers 62 may be mechanically connected in a serial string having but one male and one female serial connector for communication with other reader strings and the host computer. Each reader contains a microprocessor (not shown) for reading the chip embedded within the identification key. The reader may be equipped with a spring-loaded key contact surface and a spring wire retaining clip (not shown), as in the "Blue Dot" receptors available from Dallas Semiconductor.

Figure 12:
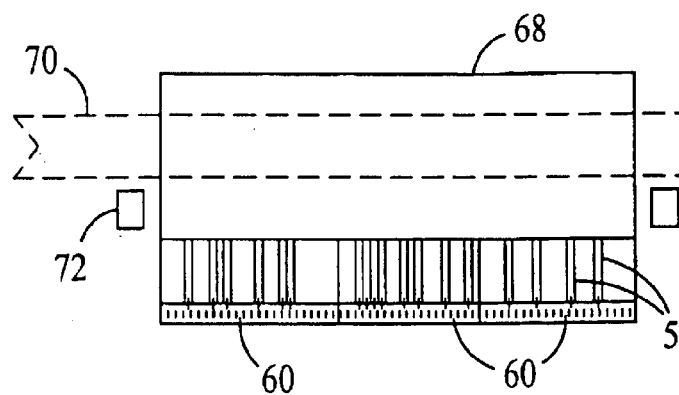
FIG. 12 is a plan view schematic illustration of a placement machine with three docked feeder banks.

FIG. 12 shows a placement machine 68 having three mounted feeder banks 60 arranged along one side such that the pick mechanism of the machine (not shown) can access the component feeders mounted on the feeder banks. A conveyor system 70 moves empty circuit boards into the placement machine from the left, and carries populated circuit boards out of the machine to the right. At the entrance to the machine an optical board sensor 72 detects the entrance of an empty circuit board, and at the exit from the machine another optical board sensor 74 detects the passage of each populated board.

Figure 13:
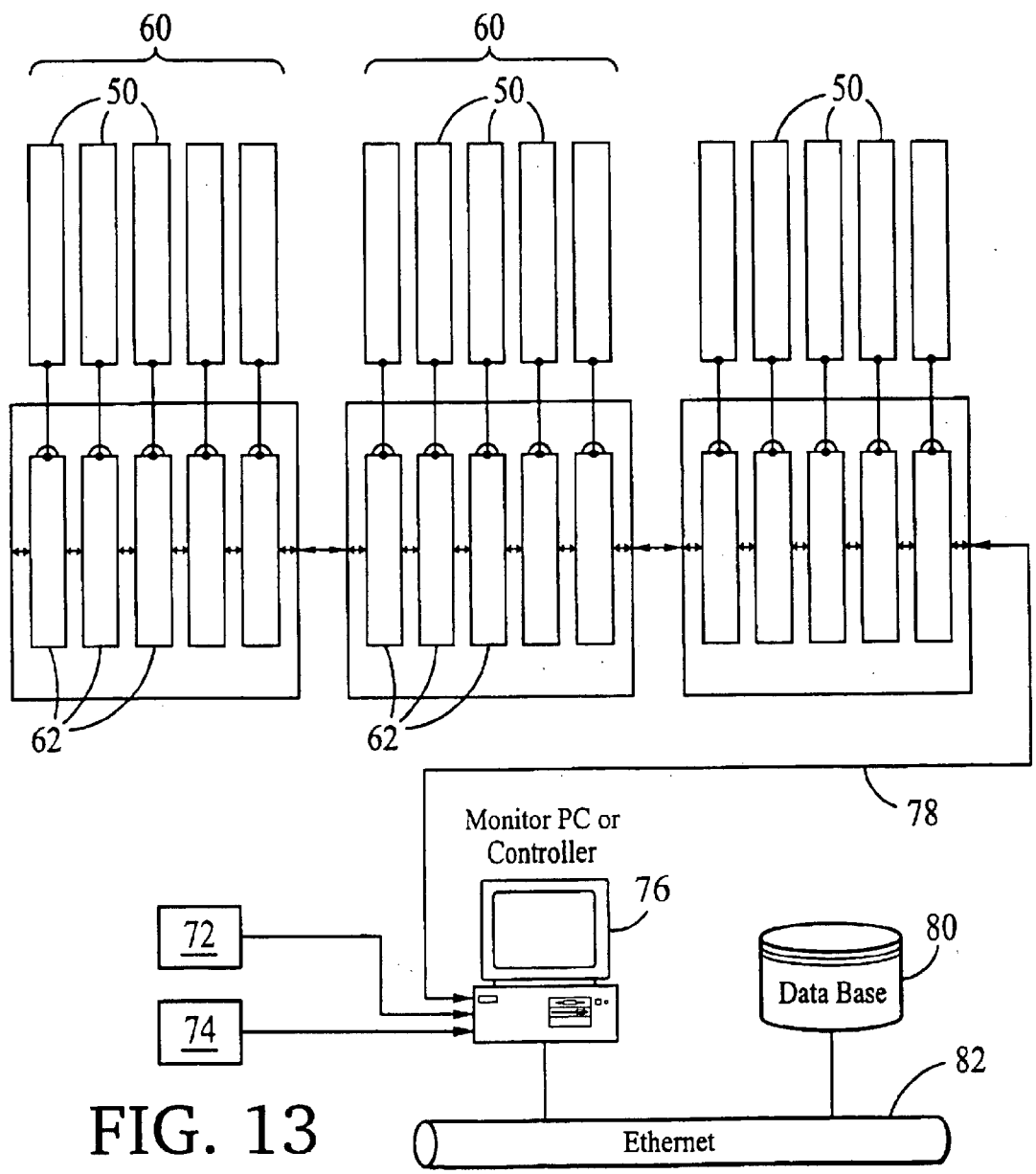
FIG. 13 schematically illustrates the communication interface between component holder identification key readers and a controller.

A system computer 76 communicates with the daisy-chained key reader strings via an RS232 communication link 78, as shown in FIG. 13. Computer 76 also receives signals from board detectors 72 and 74, and accesses a component holder status database 80 through an Ethernet connection 82. The system uses a daisy chain communication protocol to decode the docking sequence of the feeder banks 60. The daisy chain scheme connects the key reader 62 on the last slot of each feeder bank 60 to the key reader of the first slot of the next feeder bank. The monitor system 76 is always at the head of the entire chain.

The system controller 76 initiates query commands that include a "0,0" ("NUL", "NUL") delimiter, a "command" code and a "slot" code. When the command is sent from controller 76 each key reader receives the command string in a sequence corresponding to its physical position on the chain. For example, the fifth key reader always receives the command string from the fourth key reader and then passes the command string to the sixth key reader. As the command string is passed along each reader of the daisy chain, the slot code is incremented by "one". Thus, each reader is able to determine, from the command string it receives, its own position along the chain.

Using this daisy chain scheme, the feeder banks 60 can be placed in any order on the placement machine and the slot numbers will be adjusted according to where the key readers of the feeder bank are connected along the daisy chain. Another advantage of this scheme is that one key reader circuit with a fixed number of key readers can be designed for many different placement machines with different numbers of slots per feeder bank. Excess key readers 62 can always be "short circuited" on the daisy chain so that they are invisible to the host controller. Thus, a 30-key reader system can be used on feeder banks with 30 slots, 21 slots or 16 slots, for example.

Communication along the daisy chain does not depend on a dedicated "BUS". The system is designed without a BUS structure to avoid such complications as bus arbitration. This greatly reduces the complexity of the key reader circuit.

Figure 14:
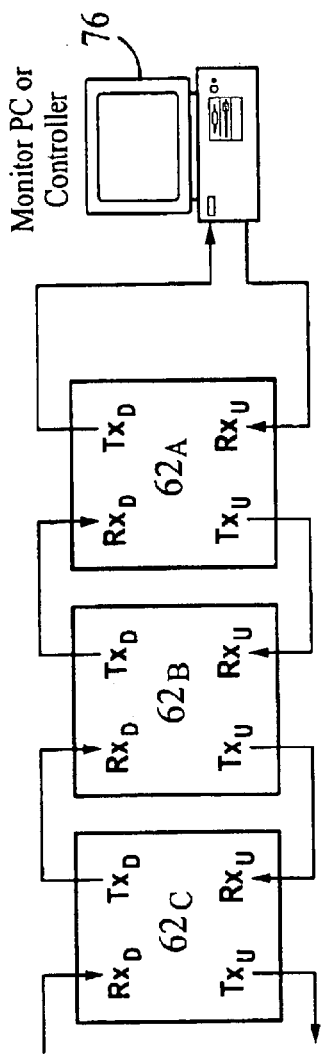
FIG. 14 shows bi-directional serial communication along a string of key readers.

Each reader 62 contains a microcontroller that has the ability to send and receive data both upstream (in the direction of decreasing slot numbers) and downstream (in the direction of increasing slot numbers) using serial RS232 protocol in a "poll" rather than an "interrupt" mode. Once the information is sent from one reader downstream, this information will be passed through all the key readers downstream until the information reaches the monitor system 76. Similarly, any command string issued by the monitor system 76 will pass through all the key readers until the information reached its target reader. Referring now to FIG. 14, a command string issued by controller 76 will initially contain a slot code of "1" as received by reader $62_A$. Reader $62_A$ will increment the slot code before passing the command string along, such that the slot code of the command string received by reader $62_B$ is "2", etc. Meanwhile, reader $62_A$ will return to controller 76 the identification code of its associated feeder, along with its slot number, reader switch status, and any other data contained within the key and requested in the command.

Figure 15:
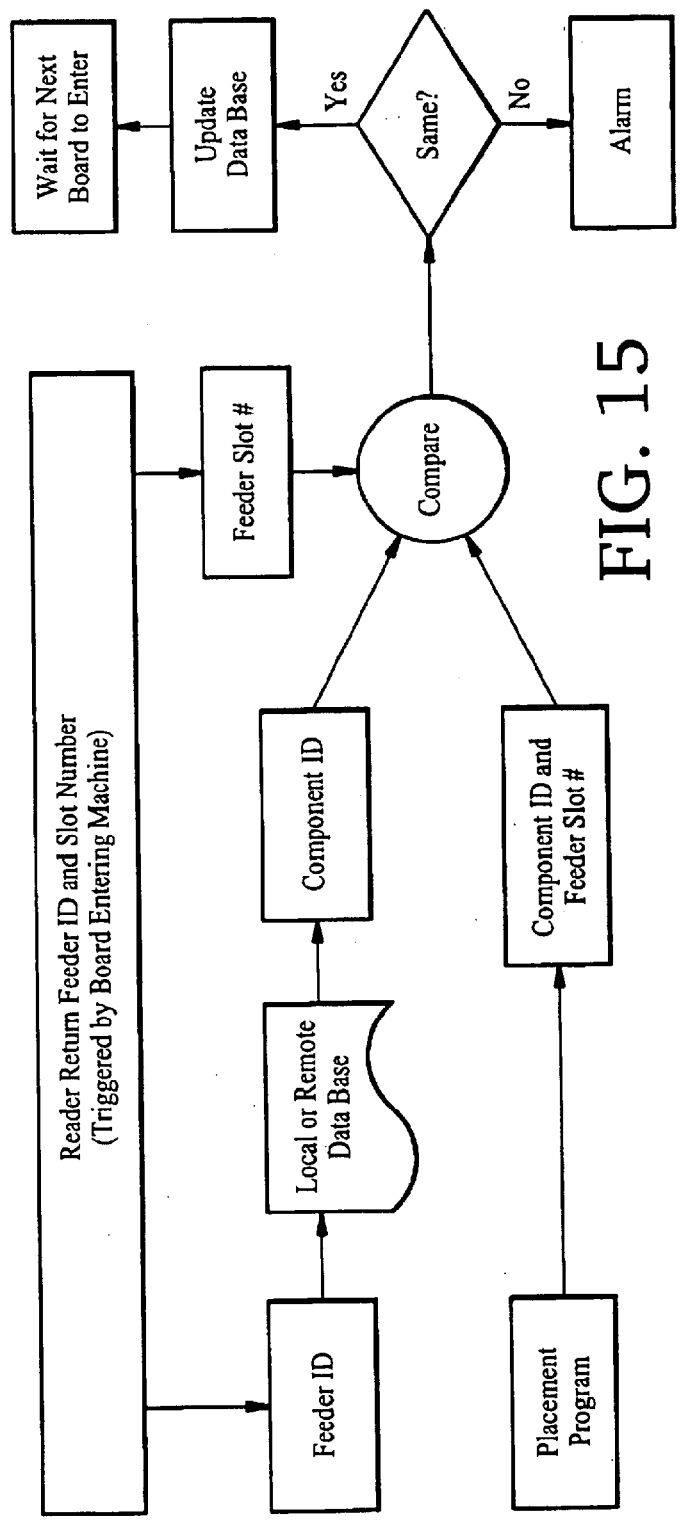
FIG. 15 is a flow diagram of automatic component holder arrangement verification and inventory updating triggered by the passage of each circuit board through the machine.

Referring now to FIG. 15, when the feeder identification codes and slot positions have been received by the controller as a result of a query, the component part numbers corresponding to the received feeder codes are looked up in the system database and then the actual part number location, as determined by the feeder query and part number look up, is compared with the placement machine program to verify that the proper part numbers are in the right locations on the machine. This re-verification before each board build helps to assure that a feeder was not repositioned incorrectly during a multi-board build, for example. By maintaining the component identification and quantity on a system-level database rather than on the individual holder keys, this embodiment requires no reprogramming of the keys when new components are loaded.

Memory within the identification keys can be used to store information regarding the status of the component holder, such as holder maintenance history, holder docking history and total pick count, operator handling and loading history, storage slot number, component part number and remaining quantity, and whether or not the component holder has undergone certain stages of the manufacturing process. For example, in one embodiment the key contains a temperature log and is queried by the controller through the reader to determine if the loaded holder has yet undergone a scheduled moisture-reducing bake cycle. The "DS1921 Thermochron iButton"® from Dallas Semiconductor is useful for this purpose, for example.

A number of embodiments of the invention have been described. Nevertheless, it will be understood that various modifications may be made without departing from the spirit and scope of the invention. Accordingly, other embodiments are within the scope of the following claims.

What is claimed is:

1. In a machine for placing electronic components on a printed circuit board, the machine comprising a series of electronic component holder receptacles for storing electronic components, and a movable pick head for picking selected components in a programmed sequence from component holders placed in the holder receptacles and placing the picked components in designated locations on a circuit board; the improvement wherein the component holder receptacles each have an associated, adjacent key receptacle for receiving a machine-readable holder identification key attached to a component holder to be loaded into the key receptacle after the component holder is loaded into the holder receptacle; and wherein the machine further comprises a controller constructed to identify, from identification keys inserted into the key receptacles, the loaded component holders to which the keys are attached.

2. The improvement of claim 1 wherein the identification keys each include a programmable memory containing holder-specific data.

3. The improvement of claim 2 wherein the data includes remaining component inventory.

4. The improvement of claim 1 wherein the key receptacles of the component holder receptacles are connected serially, for communicating with the controller over a common data path.

5. The improvement of claim 4 wherein the key receptacles of the component holder receptacles each sequentially increment and relay downstream a communication received from the controller, and transfer data to the controller indicating their position along the data path.

6. The improvement of claim 1 wherein some of the component holder receptacles are arranged in a first interchangeable bank with their associated key receptacles forming a first key receptacle string, and others of the component holder receptacles are arranged in a second interchangeable bank with their associated key receptacles forming a second key receptacle string;

the key receptacle strings each having an input serial connector and an output serial connector, for connecting the strings serially for communication with the controller when the interchangeable banks of component holder receptacles are docked on the machine.

7. The improvement of claim 1 wherein the controller is constructed to communicate serially with the machine-readable holder identification key while the movable pick head is picking electronic components from its associated component holder.

8. The improvement of claim 1 wherein the machine further comprises a circuit board output sensor for detecting an assembled board being unloaded from the machine; and wherein the controller is constructed to decrement stored inventory values associated with the loaded component holders by programmed amounts, in response to a signal received from the circuit board output sensor.

9. The improvement of claim 8 wherein the controller sounds an alarm in response to a negative component holder inventory value.

10. The improvement of claim 1 wherein the machine further comprises a circuit board input sensor for detecting a board being loaded onto the machine for component assembly, and wherein the controller is constructed to initiate a component holder placement verification sequence in response to a signal received from the circuit board input sensor.

11. The improvement of claim 10 wherein the component holder placement verification sequence includes polling the data key receptacles for information regarding their location and identification of any component holder loaded in their associated component holder receptacles.

12. A component holder for holding a quantity of electronic components on an electronic component placement machine, the holder having a machine-readable holder identification key, attached to the holder by a flexible cable and containing holder identification information, for insertion into an associated machine data key receptacle when the holder is loaded onto the placement machine.

13. The component holder of claim 12 wherein the identification key contains a programmable memory containing holder status information.

14. The component holder of claim 13 wherein the holder status information includes a part number associated with an electronic component loaded onto the holder.

15. The component holder of claim 13 wherein the holder status information includes a loaded component quantity.

16. The component holder of claim 13 wherein the holder status information includes holder maintenance data.

17. The component holder of claim 13 wherein the holder status information includes an indication of whether the holder has undergone a specific process.

18. The component holder of claim 17 wherein the specific process comprises a heating cycle.

* * * * *